United States Patent
Lee et al.

(10) Patent No.: US 9,200,363 B2
(45) Date of Patent: Dec. 1, 2015

(54) AA' STACKED GRAPHITE AND FABRICATION METHOD THEREOF

(75) Inventors: Jae-Kap Lee, Seoul (KR); So-Hyung Lee, Seoul (KR); Jae-Pyoung Ahn, Seoul (KR); Seung-Cheol Lee, Seoul (KR); Wook-Seong Lee, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 1019 days.

(21) Appl. No.: 12/512,942

(22) Filed: Jul. 30, 2009

(65) Prior Publication Data
US 2010/0028573 A1     Feb. 4, 2010

(30) Foreign Application Priority Data
Jul. 31, 2008   (KR) .................. 10-2008-0075318

(51) Int. Cl.
C01B 31/04 (2006.01)
C23C 16/26 (2006.01)
B82Y 30/00 (2011.01)

(52) U.S. Cl.
CPC ................. *C23C 16/26* (2013.01); *B82Y 30/00* (2013.01); *C01B 31/04* (2013.01); *C01P 2002/78* (2013.01); *Y10T 428/13* (2015.01); *Y10T 428/261* (2015.01); *Y10T 428/298* (2015.01); *Y10T 428/2982* (2015.01)

(58) Field of Classification Search
USPC .............. 428/408, 367; 427/228, 249.6, 577; 423/448, 460
See application file for complete search history.

(56) References Cited

PUBLICATIONS

Pierson, H.O. "Handbook of Carbon, Graphite, Diamond and Fullerenes—Properties, Processing and Applications," 1993, pp. 43-45, 70-86, 146-147, 185.*
Saito et al., "Interlayer spacings in carbon nanotubes," Jul. 15, 1993, American Physical Society, Physical Review B, vol. 48, No. 3, pp. 1907-1909.*
Coloma et al., "Heat-Treated Carbon Blacks as Supports for Platinum Catalysts," Jul. 1995, Journal of Catalysis, vol. 154, pp. 299-305.*
Kolmogorov et al., "Registry-dependent interlayer potential for graphitic systems," 2005, American Physical Society, Physical Review B, vol. 71, pp. 235415-1 to 235415-6.*
Bernal et al., Proc. Roy. Soc. London, Ser. A (1924) 106:749-773.
Biscoe et al., Journal of Applied Physics (1942) 13:364.
Lachter and Bragg, Physical Review B (1986) 33(12):8903-8905.
Office Action from Koran Patent Application No. 10-2008-0075318, dated Jul. 9, 2010.

* cited by examiner

*Primary Examiner* — David Sample
*Assistant Examiner* — Nicholas W Jordan
(74) *Attorney, Agent, or Firm* — Morrison & Foerster LLP

(57) ABSTRACT

Disclosed is AA' graphite with a new stacking feature of graphene, and a fabrication method thereof. Graphene is stacked in the sequence of AA' where alternate graphene layers exhibiting the AA' stacking are translated by a half hexagon (1.23 Å). AA' graphite has an interplanar spacing of about 3.44 Å larger than that of the conventional AB stacked graphite (3.35 Å) that has been known as the only crystal of pure graphite. This may allow the AA' stacked graphite to have unique physical and chemical characteristics.

3 Claims, 4 Drawing Sheets

AA stacking

Turbostratic stacking

AA' stacking

AA' STACKED GRAPHITE AND FABRICATION METHOD THEREOF

CROSS-REFERENCE TO RELATED APPLICATIONS

The present disclosure relates to subject matter contained in priority Korean Application No. 10-2008-0075318, filed on Jul. 31, 2008, which is herein expressly incorporated by reference in its entirety.

BACKGROUND OF THE INVENTION

1. Field of the Invention

The present invention belongs to the field of graphitic materials i.e., a new AA' stacked graphite and a method for fabricating the same.

2. Background of the Invention

Graphite is a representative graphitic material, and is composed of graphene i.e., a single layer trigonal carbon honeycomb. Thus, graphite is named as a layered structure and can be classified into AB or AA graphite according to stacking types of graphene. It has been well known that AB stacked graphite (or AB graphite) is the only stable crystalline that exists in nature (FIG. 1) (i.e., AB graphite: stable graphite with an interplanar spacing of 3.35 Å) since 1924 [Bernal et al., Proc. Roy. Soc. London, Ser. A 106, 749-773]. However the AA stacking of graphene is not present in pure graphite because it is energetically unstable. AA stacked graphite (or AA graphite) (FIG. 2) can appear only when Li intercalates into graphene layers of AB graphite (i.e., AA graphite: unstable graphite with an interplanar spacing of about 3.53 Å). Disordered graphite (in lack of the order in stacking graphene), termed turbostratic (FIG. 3) suggested by Biscoe et al. [Journal of Applied Physics 13 (1942) 364], is the generally accepted alternative stacking arrangement for graphitic materials. This has been extended to include multi-wall carbon nanotubes (MW CNTs) discovered by Iljima in 1991.

SUMMARY OF THE INVENTION

An object of the present invention is to provide another type of crystalline graphite i.e., AA' stacked graphite (FIG. 4) where graphene is stacked in the sequence of AA' which is a quasi-stable stacking between the stable AB and the unstable AA.

Another object of the present invention is to provide a method for fabricating quasi-stable AA' graphite by controlling processing variables.

To achieve these and other advantages and in accordance with the purpose of the present invention, as embodied and broadly described herein, there is provided AA' graphite, wherein the alternate graphitic planes are translated by half the hexagon width from the AA structure.

To achieve these and other advantages and in accordance with the purpose of the present invention, as embodied and broadly described herein, there is also provided a method for fabricating the AA' stacked graphite, the method characterized by thermally treating non-crystalline carbon material at a temperature of 1,000~2,000° C. where the stable AB stacking cannot be formed.

According to another aspect of the present invention, there is provided a method for fabricating the AA' stacked graphite, the method characterized by performing a chemical vapor deposition (CVD) synthesis where hydrocarbon is generally used as reaction gas (a gas pressure of ~760 Torr (~1 atm); a reaction temperature of 500~1,000° C.).

The present invention has the following advantages.

Firstly, in the present invention, a new graphitic material i.e., AA' stacked graphite is obtainable.

The AA' stacked graphite has a larger interplanar spacing (i.e., an interplanar distance between graphene layers) (about 3.44 Å) than that of the AB stacked graphite (about 3.35 Å). Therefore, the graphene layers stacked in the AA' manner can be easily separated from each other and have a unique electric characteristic.

Secondly, the AA' stacked graphite can be used as an electrode material for a secondary battery and a flexible display, a hydrogen storage material or a new matrix for Graphite Intercalation Compounds (GIC) by a intercalation of other elements.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Description will now be given in detail of the present invention, with reference to the accompanying drawings.

Hereinafter, AA' stacked graphite and a fabrication method thereof will be explained in more detail with reference to the attached drawings.

Figure 4:
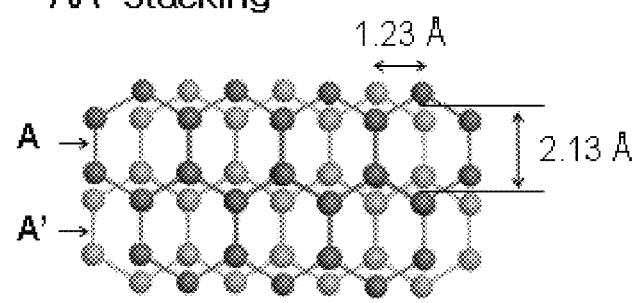
FIG. 4 is a plane view showing the structure of AA' stacked graphite according to the present invention, where graphene is stacked in the sequence of AA'.
Figure 5:
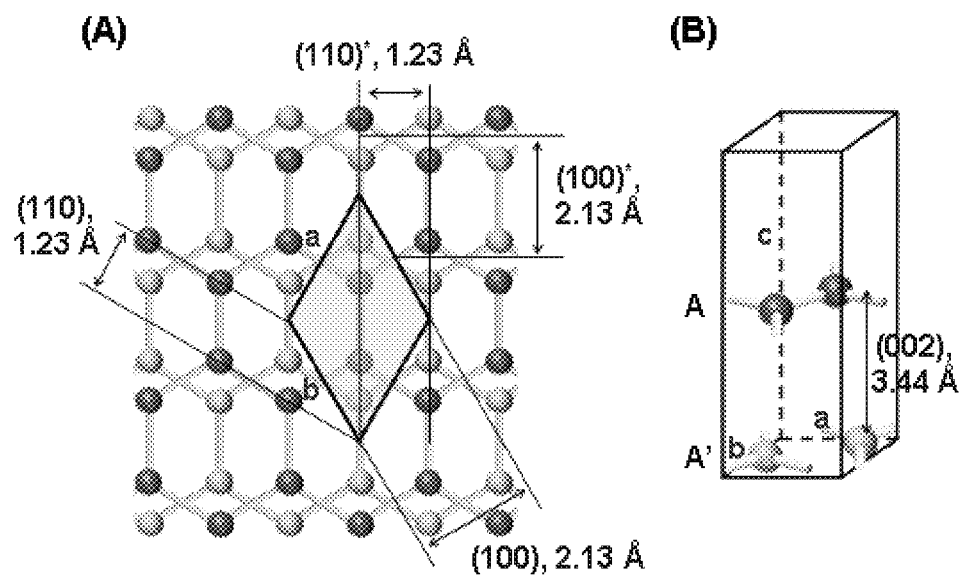
FIG. 5 shows a crystal structure of the AA' stacking, assigned to a space group of a hexagonal (simple hexagonal, space group p6/mmm #191)

The AA' stacked graphite of the present invention has a structure in which alternate graphene planes are translated by half the hexagon width (1.23 Å) as shown in FIG. 4 and FIG. 5.

In order to understand the AA' stacked graphite of the present invention, we will explain the two typical stackings of graphene, AB and AA where the former is known as that of the conventional crystalline graphite structure and the latter can not exist in pure graphite because it is energetically unstable.

Figure 1:
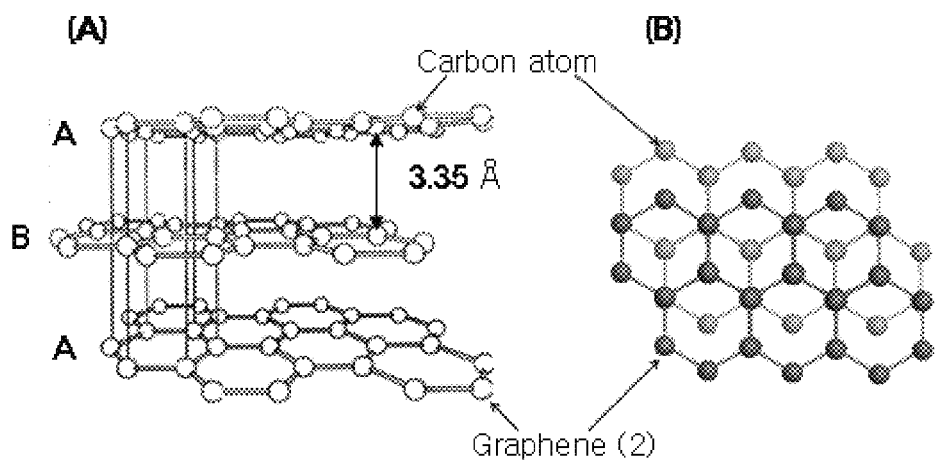
FIG. 1 is a view showing the structure of AB stacked graphite where graphene is stacked in the sequence of AB.

Referring to FIG. 1, the AB stacked graphite is described by a space group of a hexagonal (#194). Here, a=b=2.46 Å, c=6.70 Å, $\alpha=\beta=90°$ and $\gamma=120°$. That is, an interplanar spacing of the AB graphite is 3.35 Å i.e., ½ of c.

Figure 2:
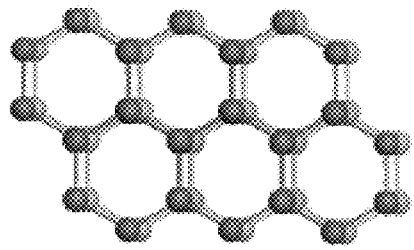
FIG. 2 is a planar view showing the structure of AA stacked graphite where graphene is stacked in the sequence of AA.
Figure 3:
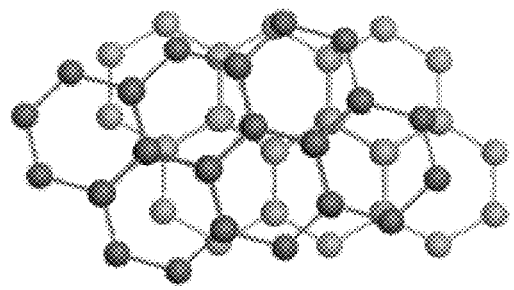
FIG. 3 is a planar view showing the structure of turbostratic graphite where graphene is stacked disorderly.

The AA stacked graphite is described by a space group of a simple hexagonal (#191). Here, a=b=2.46 Å, c=3.55 Å, $\alpha=\beta=90°$ and $\gamma=120°$ (refer to FIG. 2). That is, an interplanar spacing of the AA stacked graphite is 3.55 Å.

The structure of AA' stacked graphite of the present invention could not be described with all of the 230 crystal space groups. Thus, we assigned the crystal structure of AA' graphite to a simple hexagonal space group. Four atoms, consisting of two atoms on each of the A and A' layers, are contained within the primitive unit cell of AA' graphite. The former two atoms at (⅓, ⅔, ½), (⅔, ⅓, ½) are linked to the 2(d) site (⅓, ⅔, ½) of the space group whereas the latter two atoms at (⅙, ⅚, 0), (⅚, ⅙, 0) cannot be defined in the space group. Two kinds of both the (100) and the (110) planes appear, and we designate the distinctive planes as (100)* and (110)*, respectively. Due to a lack of experimental data concerning the atomic positions within the space group the X-ray diffraction (XRD) pattern of AA' graphite was derived from that of AA graphite and it can be also derived from other space groups, particularly orthorhombic or monoclinic space group. The (001), (100), (102), (002), (014), (110), (112), (006), (200) and (022) peaks appear in the pattern of AA graphite. The (h0l), (0kl) and (hkl) reflections are absent in AA' graphite, due to the insertion of additional atoms from the A' graphene layers into the eclipsed AA form. As a result the available reflections for AA' graphite are due to the (002), (100), (004), (110), (006) and (200) planes, where the intensity of the (110) plane, that is (110)*, should be stronger due to the periodic overlap of graphene layers, as shown in FIG. 5A ((006) (2θ=84.4°) and (200) (2θ=92.6°) peaks are normally not observed because their intensities are too weak). One outstanding feature of the pattern of AA' graphite is the disappearance of the (101) peak (2θ=44.6°), the (102) peak (2θ=50.4°) and the (112) peak (2θ=83.4°); the intensities are relatively strong within the pattern of AB graphite. Thus, the absence of the (101), (102) and (112) peaks within the XRD patterns of graphitic materials is a criterion for AA' graphite.

This AA' graphite of the present invention, which appears in the forms of a rod, a tube, or a particle shape, can be fabricated by a heat treatment of non-crystalline carbon materials (cokes etc.), or by a chemical vapor deposition (CVD) synthesis using hydrocarbon gases such as $C_2H_2$, $C_2H_4$ and $CH_4$.

Firstly, will be explained the fabrication method for AA' graphite by a heat treatment method.

Generally, graphite is fabricated by a heat treatment i.e., crystallization of non-crystalline carbon material such as polyvinyl chloride and coke. The heat treatment for fabrication of quasi-stable AA' graphite should be performed at a temperature lower than 2,000° C. because a treatment at a higher temperature forms stable AB graphite. We can fabricate a high purity AA' graphite (~99%) with a heat treatment of oil coke at 1000° C. for 2 hours. When polyvinyl chloride is used as a raw material, a heat treatment at 1000° C. for 20 minutes is enough to fabricate AA' graphite although its purity was worse relatively (80%).

Next, will be explained the method for fabricating AA' graphite by using a CVD process.

The CVD process is commonly used to synthesize high purity carbon materials. Graphitic carbon material (normally in the form of sheets, tubes, spheres, particles in nanometer sizes) is obtainable at a temperature lower than 1000° C., that is, lower than the temperature used for the heat treatment. Particularly, plasma assisted CVD processes can synthesize carbon nano materials even at a low temperature of 500~700° C. Thus, CVD method is ideal for synthesis of AA' graphite in a quasi-stable state, rather than AB graphite in a stable state. Deposition for AA' graphite is performed under a vacuum state (below 760 Torr) using hydrocarbon gases as a source of carbon.

Figure 7:
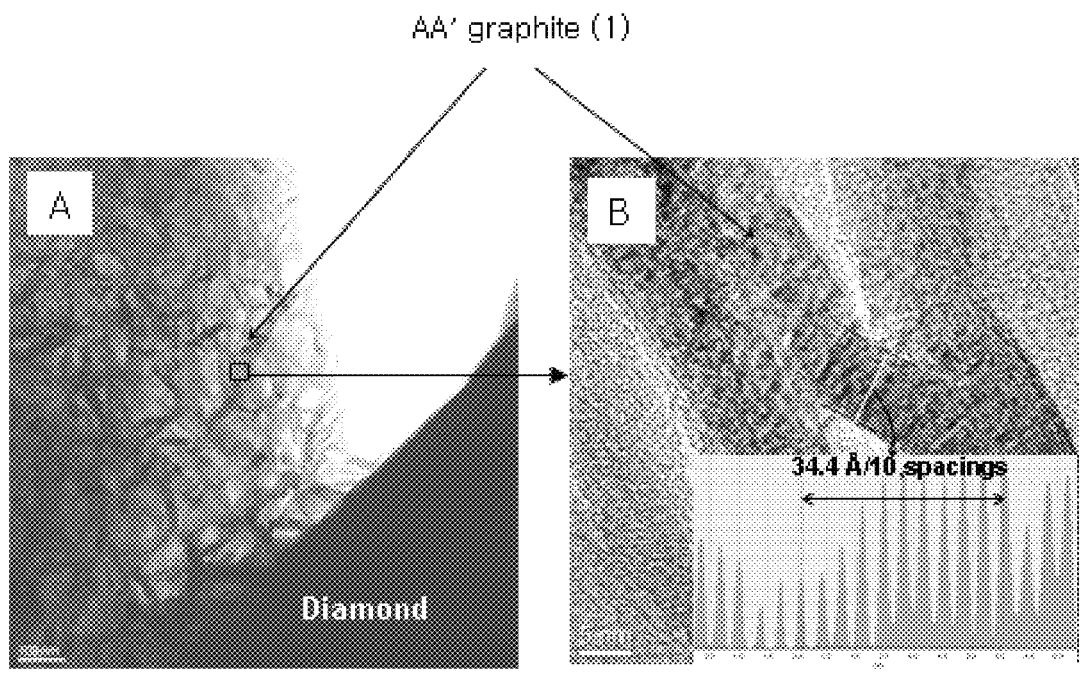
FIG. 7A is a TEM (transmission electron microscope) image showing AA' graphite in the form of a nano-flake synthesized by a CVD method according to the present invention.
FIG. 7B is an HRTEM (high-resolution transmission electron microscope) image showing graphene fringes of the AA' stacked nano-flakes where an interplanar spacing is measured to be 3.44 Å.

In the preferred embodiment of the present invention, AA' graphite in the form of nanoflakes was synthesized in a DC plasma CVD apparatus (FIG. 7). Here, methane (a hydrocarbon gas) was used as reaction gas, and a deposition was performed at a condition; 100 Torr, about 800° C. and 200 sccm.

Figure 8:
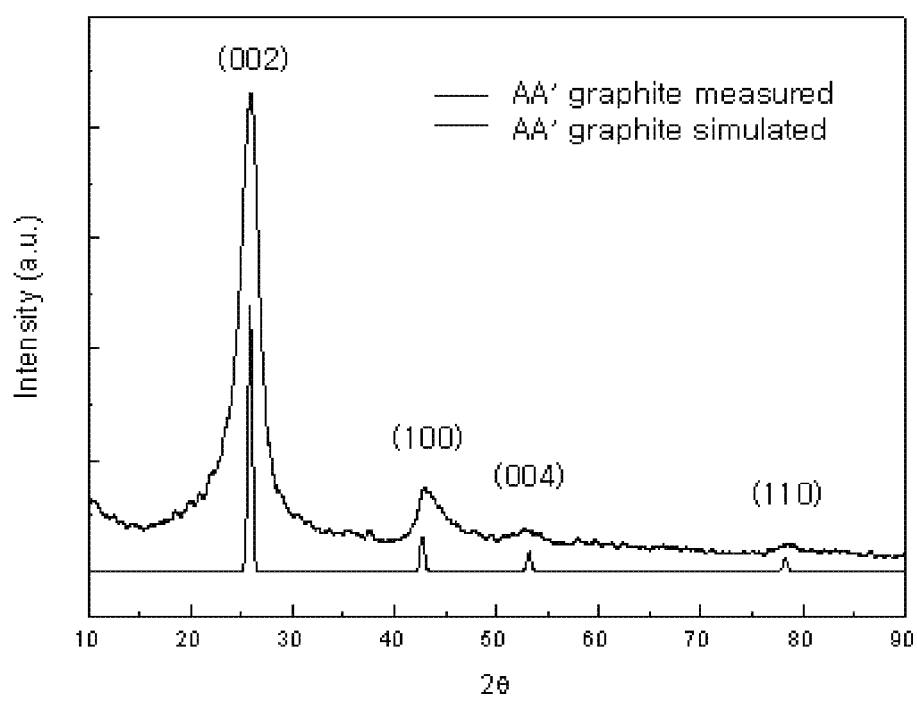
FIG. 8 shows an XRD pattern of a graphitic material in the form of a nanotube where characteristic (002), (100), (004) and (110) peaks for AA' graphite are identical to those observed in the derived AA' graphite pattern shown in FIG. 6C.

It is preferable to analyze the AA' graphite by using an XRD method as shown in FIG. 8 although the characteristic XRD signals for AA' graphite (FIG. 6C) can vary with the degree of crystallization of graphene layers and the existence of defects. Also SAED (Selected Area Electron Diffraction) pattern of TEM is another possible tool to analyze the AA' graphite as confirmed in FIG. 7. There is a possibility that current AA' graphite may correspond to some of previous graphite, analyzed as turbostratic.

Preferred Embodiment 1

AA' graphite was fabricated by using oil coke as a raw material. Firstly, the raw material was thermally-treated at 1,000° C. in an argon atmosphere vacuum furnace for one hour. We further treated the sample at 1,300° C. for two hours. The graphite sample showed a purity of 99.5%. XRD patterns for the samples revealed peaks at 2θ=25.8°, 42.4°, 53.2° and 77.5° which correspond to (002), (100), (004) and (110) of AA' graphite, but without the peaks corresponding to (101) (2θ=44.6°), (102) (2θ=50.4°) and (112) (2θ=83.4°) (the weak (006) and (200) peaks for AA' graphite (FIG. 6C) were not observed). This shows that the samples are AA' stacked graphite.

Preferred Embodiment 2

AA' graphite was fabricated by using polyvinyl chloride as a raw material. Firstly, the raw material was stabilized at 500° C. in an argon atmosphere vacuum furnace for one hour. Then, the sample was thermally-treated at 1,000° C. for 30 minutes. The graphite sample showed a purity of 97%. XRD patterns for the samples revealed the peaks of (002), (100), (200) and (110) planes, but without the peaks of (101), (102), (103) and (112) planes. This shows that the samples are AA' stacked graphite.

Preferred Embodiment 3

Figure 6:
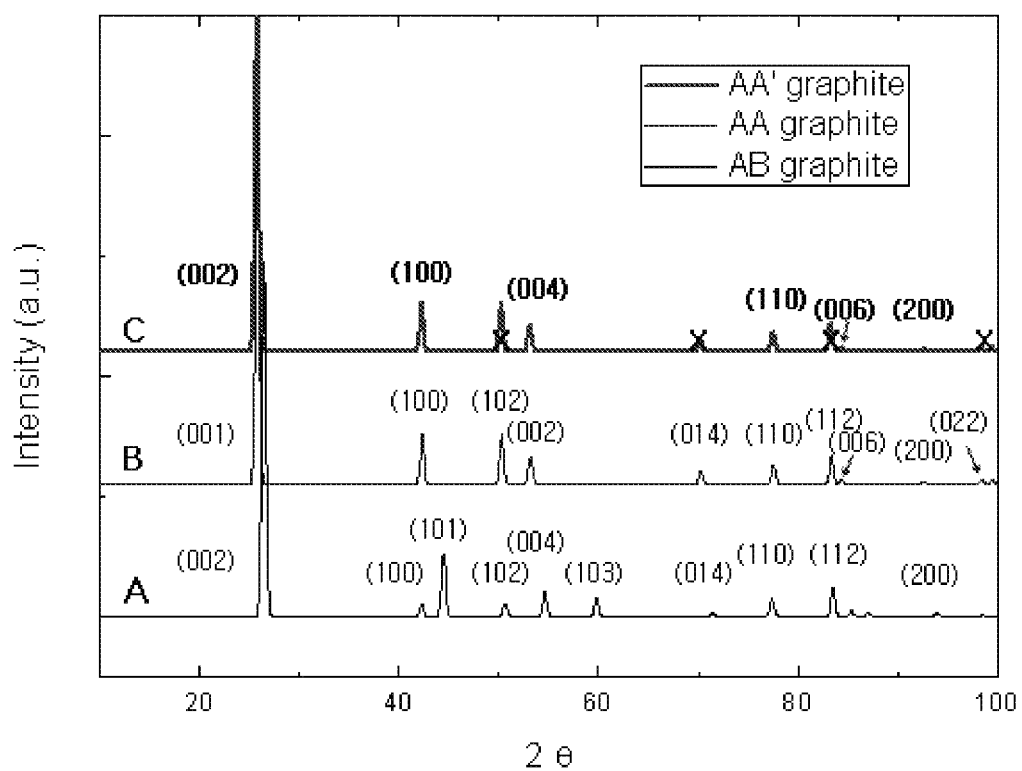
FIG. 6 shows simulated XRD patterns for AB graphite (hexagonal, space group p6$_3$/mmc #194) (A), AA graphite (simple hexagonal, space group p6/mmm #191) (B) and AA' graphite (C) derived from the simulated pattern of the AA simple hexagonal structure due to a lack of information about the space group of the AA' stacked crystal. The (102), (114), (112) and (022) peaks (marked by "X") do not appear in the XRD pattern of AA' graphite.

AA' graphite was synthesized on a molybdenum substrate by using a direct current (DC) plasma CVD apparatus under a condition; a gas flow of 200 sccm (10% $CH_4$ and 90% $H_2$), a gas pressure of 100 Torr and a deposition temperature of 800° C. And, a synthesis time was 30 minutes. Graphitic materials in the form of nanoflakes were deposited with diamond as shown in FIG. 6. The interplanar spacing of the nanoflakes was measured to be 3.44 Å. This shows that the samples are AA' stacked graphite.

Preferred Embodiment 4

Tubular AA' graphite was synthesized by a thermal CVD approach. A silicon substrate on which nickel is coated in a nano-thickness was placed in a vacuum furnace and maintained at 1,000° C. for 30 minutes after introducing methane gas; a gas pressure of 500 mTorr and a gas flow of 200 sccm. The graphitic materials obtained on the silicon substrate were confirmed to be tubular materials with an inner diameter of ~ a few nm, an outer diameter of ~50 nm and a length of several μm. XRD analysis showed that the materials were AA' graphite because XRD patterns of the nanotubes revealed the unique signals for AA' graphite i.e., at 2θ=25.8°, 42.4°, 53.2° and 77.5° which correspond to (002), (100), (004) and (110) as shown in FIG. 7 (the weak (006) and (200) peaks for AA' graphite (FIG. 6C) were not observed).

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications and variations will be apparent to those skilled in the art. The features, structures, methods and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

The invention claimed is:

1. A method to prepare AA' stacked crystalline graphite which comprises
    a) heating non-crystalline carbon material at a temperature of 1,000° C. for an hour under an inert gas atmosphere; and
    b) increasing the temperature to 1,300° C. and maintaining said temperature for two hours.

2. The method of claim 1, wherein the non-crystalline carbon material is polyvinyl chloride or coke.

3. The method of claim 1, wherein said AA' stacked graphite has AA' stacked graphene layers in which alternate graphene layers are stacked to be shifted by 1.23 Å parallel from AA stacking.

* * * * *